US010759898B2

(12) United States Patent
He et al.

(10) Patent No.: US 10,759,898 B2
(45) Date of Patent: Sep. 1, 2020

(54) FUSED THIOPHENE-ARYLTHIADIAZOLE POLYMERS, METHODS OF MAKING SUCH POLYMERS, AND USES THEREOF

(71) Applicant: Corning Incorporated, Corning, NY (US)

(72) Inventors: Mingqian He, Horseheads, NY (US); James Robert Matthews, Painted Post, NY (US); Weijun Niu, Painted Post, NY (US); Arthur Lawrence Wallace, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 96 days.

(21) Appl. No.: 15/705,722

(22) Filed: Sep. 15, 2017

(65) Prior Publication Data
US 2018/0079858 A1 Mar. 22, 2018

Related U.S. Application Data

(60) Provisional application No. 62/395,478, filed on Sep. 16, 2016.

(51) Int. Cl.
C08G 61/12 (2006.01)
H01B 1/12 (2006.01)
H01L 51/00 (2006.01)

(52) U.S. Cl.
CPC ......... C08G 61/126 (2013.01); C08G 61/123 (2013.01); H01B 1/127 (2013.01); H01L 51/0036 (2013.01); H01L 51/0043 (2013.01); C08G 2261/12 (2013.01); C08G 2261/124 (2013.01); C08G 2261/1412 (2013.01); C08G 2261/18 (2013.01); C08G 2261/3243 (2013.01); C08G 2261/3246 (2013.01); C08G 2261/3323 (2013.01); C08G 2261/364 (2013.01); C08G 2261/414 (2013.01); C08G 2261/512 (2013.01); C08G 2261/596 (2013.01); C08G 2261/92 (2013.01)

(58) Field of Classification Search
CPC ..... C08G 61/123; C08G 61/126; H01B 1/127
See application file for complete search history.

(56) References Cited

U.S. PATENT DOCUMENTS

| 7,705,108 | B2 | 4/2010 | He |
| 7,838,623 | B2 | 11/2010 | He |
| 7,893,191 | B2 | 2/2011 | He |
| 7,919,634 | B2 | 4/2011 | He et al. |
| 8,217,183 | B2 | 7/2012 | He et al. |
| 8,278,346 | B2 | 10/2012 | He et al. |
| 8,278,410 | B2 | 10/2012 | He et al. |
| 8,349,998 | B2 | 1/2013 | He |
| 8,389,669 | B2 | 3/2013 | He |
| 8,487,114 | B2 | 7/2013 | He et al. |
| 8,642,719 | B2 | 2/2014 | He et al. |
| 8,846,855 | B2 | 9/2014 | He et al. |
| 9,035,015 | B1 | 5/2015 | Wen et al. |
| 2012/0035375 | A1* | 2/2012 | He ............ C07D 495/22 549/42 |
| 2013/0085256 | A1 | 4/2013 | He et al. |
| 2013/0109821 | A1 | 5/2013 | He et al. |
| 2014/0124035 | A1 | 5/2014 | Byrne et al. |
| 2015/0065722 | A1 | 3/2015 | He et al. |
| 2015/0129038 | A1 | 5/2015 | Wen et al. |

FOREIGN PATENT DOCUMENTS

| CN | 101671428 B | | 8/2011 | |
| KR | 101099601 B1 | * | 12/2011 | |
| WO | WO-2014104979 A1 | * | 7/2014 | ......... H01L 51/0036 |
| WO | WO-2016025632 A1 | * | 2/2016 | ........... C07D 285/14 |
| WO | WO-2016041615 A1 | * | 3/2016 | ......... H01L 51/0036 |

OTHER PUBLICATIONS

Machine translation of KR 101099601 B1, retrieved May 2019. (Year: 2019).*
Patil et al. "Synthesis and characterization of dithienothiophene/benzothiazole based low band gap donor-acceptor copolymers for bulk hetero junction photovoltaic cells", Synthetic Metals, 2011, 161,1838-1844. (Year: 2011).*
International Search Report and Written Opinion PCT/US2017/051713 dated Dec. 12, 2017.
Zhong et al. "Low band gap dithienogermolodithiophene copolymers with tunable acceptors and side-chains for organic solar cells" Journal of Materials Chemistry A 1(47) 2013, pp. 14973.
Allard et al., "Organic Semiconductors for solution-processable field-effect transistors (OFETs)" U. Angew. Chem. Int. Ed. 2008, 47, 4070-4098.
Bronstein et al; "Thieno [3,2-b]Thiophene-Diketopyrrolopyrrole-Containing Polymers for High-Performance Organic Field-Effect Transistors and Orgainc Photovoltaic Devices"; J. Am. Ceram. Soc.; 2011; 133; 3272-3275.
Fong et al; "Tetrathienoacene Copolymers as High Mobility, Soluble Organic Semiconductors"; J. Am. Chem. Soc.; 2008; 130; 13202-13203.
Fu et al; "Enhancing Field-Effect Mobility of Conjugated Polymers Through Rational Design of Branched Side Chains"; Adv. Funct. Mater,; 2014; 24, 3734-3744.
He et al; "Alkylsubstituted Thienothiophene Semiconducting Materials: Structure-Property Relationships"; J. Am. Ceram. Soc.; 1009; 131; 11930-11938.
Holliday et al; "Advances in Charge Carrier Mobilities of Semi-conducting Polymers Used in Organic Transistors"; Chem. Mater.; 2014; 26; 647-663.
Kang et al; "Record High Hole Mobility in Polymer Semiconductors Via Side-Chain Engineering"; J. Am. Chem. Soc.; 2013; 135; 14896-14899.

(Continued)

Primary Examiner — Nicole M. Buie-Hatcher

(57) ABSTRACT

Described herein are compositions including heterocyclic organic compounds. More specifically, described herein are bicyclic thiadiazole-based compounds that are combined with fused thiophenes structures, along with methods for making such compounds, and uses thereof.

8 Claims, 3 Drawing Sheets

(56) References Cited

OTHER PUBLICATIONS

Katz; "Recent Advances in Semiconductor Performance and Printing Processes for Organic Transistor-Based Electronics"; Chem. Mater.; 2004; 16; 4748-4756.

Lei et al; "Influence of Alkyl Chain Branching Positions on the Hold Mobilities of Polymer Thin-Film Transistors"; Adv. Mater.; 2012, 24, 6457-6461.

Li et al; "A High Mobility P-Type DPP-Thieno [3,2-b]Thiophene Copolymer for Organic Thin-Film Transistors"; Adv. Mater. 2010, 22, 4862-4866.

Matthews et al; "Scalable Synthesis of Fused Thiophene-Dikethopyrrolophyrrole Semiconducting Polymers Processed From Nonchlorinated Solvents Into High Performance Thin Film Transistors"; Chem. Mater.; 2013; 25; 782-789.

Meager et al; "Photocurrent Enhancement From Diketopyrrolopyrrole Polymer Solar Cells Through Alkyl-Chain Branching Point Manipulation"; J. Am. Chem. Soc.; 2013, 135, 11537-11540.

Sirringhaus et al., "Two-dimensional charge transport in self-organized, high-mobility conjugated polymers" Nature 1999, vol. 401, pp. 685-688.

Street; "Unraveling Charge Transport in Conjugated Polymers"; Science; vol. 341; Issue 6150; 2013 pp. 1072-1073.

Sun et al; "Record High Electron Mobility of 6.3 cm2V-1s-1 Achieved for Polymer Semiconductors Using a New Building Block"; Adv. Mater.; 2014; 26; 2636-2642.

Tsao et al; "Ultrahigh Mobility in Polymer Field-Effect Transistors by Design"; J. Am. Chem. Soc.; 2011; 133; 2605-2612.

Tseng et al; "High-Mobility Field-Effect Transistors Fabricated With Macroscopic Aligned Semiconducting Polymers"; Adv. Mater. 2014; 26; 2993-2998.

Yun et al; "Conformation-Insensitive Ambipolar Charge Transport in a Diketopyrrolopyrrole-Based Co-Polymer Containing Acetylene Linkages"; Chem. Mater. 2014; 26; 3928-3937.

Zhang et al. "Low Bandgap p-Conjugated Copolymers Based on Fused Thiophenes and Benzothiadiazole: Synthesis and Structure-Property Relationship Study" Journal of Polymer Science, Part A: Polymer Chemistry (2009), 47, (20), 5498-5508.

\* cited by examiner

FUSED THIOPHENE-ARYLTHIADIAZOLE POLYMERS, METHODS OF MAKING SUCH POLYMERS, AND USES THEREOF

BACKGROUND

This application claims the benefit of priority under 35 U.S.C. § 119 of U.S. Provisional Application Ser. No. 62/395,478, filed on Sep. 16, 2016, the content of which is relied upon and incorporated herein by reference in its entirety.

FIELD

Described herein are compositions including heterocyclic organic compounds. More specifically, described herein are bicyclic thiadiazole-based compounds that are combined with fused thiophenes structures, along with methods for making such compounds, and uses thereof.

TECHNICAL BACKGROUND

Highly conjugated organic materials are currently the focus of a significant amount of research activity in the electronics industry. These compounds are being investigated for use in a variety of applications, including organic field effect transistors (OFETs), organic thin-film transistors (OTFTs), organic light-emitting diodes (OLEDs), electro-optic (EO) applications, as conductive materials, as two photon mixing materials, as organic semiconductors, and as non-linear optical (NLO) materials. Highly conjugated organic materials may find utility in devices such as RFID tags, electroluminescent devices in flat panel displays, and in photovoltaic and sensor devices.

Conjugated organic materials are of particular interest due to their unique and potentially advantageous electronic and optoelectronic properties. However, in order for a material to be a viable candidate, the devices made from the material need to meet a number of critical parameters. For example, the performance of an OFET device is usually evaluated by several parameters: charge carrier mobility, current On/Off ratio, threshold voltage and the magnitude of the On and Off current. Further, it is advantageous if it is possible to achieve these parameters via a solution deposition process with a minimum number of processing steps. Therefore, semiconducting materials that are stable as inks or in solution form are particularly advantageous.

Materials such as pentacene, poly(thiophene), poly(thiophene-co-vinylene), poly(p-phenylene-co-vinylene) and oligo(3-hexylthiophene) have been intensively studied for use in various electronic and optoelectronic applications. Fused thiophene-containing compounds have also been found to have advantageous properties. For example, bis-dithieno[3,2-b:2',3'-d]thiophene has been found to efficiently π-stack in the solid state, possesses good mobility (up to 0.05 cm$^2$/V·s), and has a high on/off ratio (up to 10$^8$). Oligomers and polymers of fused thiophenes, such as oligo- or poly(thieno[3,2-b]thiophene) and oligo- or poly(dithieno [3,2-b:2'-3'-d]thiophene) have also been suggested for use in electronic and optoelectronic devices, and have been shown to have acceptable conductivities and non-linear optical properties. However, there remains a need for organic materials having improved solubility, processability, and oxidative stability.

SUMMARY

Described herein are polymer compositions including heterocyclic organic compounds, such as fused thiophene compounds, methods for making them, and uses thereof. The compositions and methods described herein possess a number of advantages over prior art compositions and methods. For example, the substituted fused thiophene compositions described herein may be made to be more soluble and processable than the analogous unsubstituted thiophene compositions. Polymers and oligomers including the fused thiophene moieties described herein may be processable using conventional spin-coating operations. Further, the compositions described herein may be made with substantially no β-H content, greatly improving the oxidative stability of the compositions.

In an aspect (1), the disclosure provides a polymer comprising the repeat unit of formula 5, 6, 7, or 8:

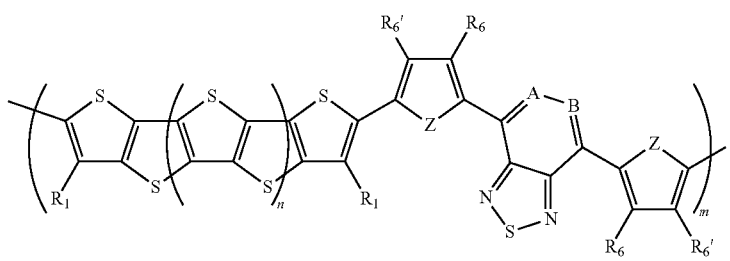

5

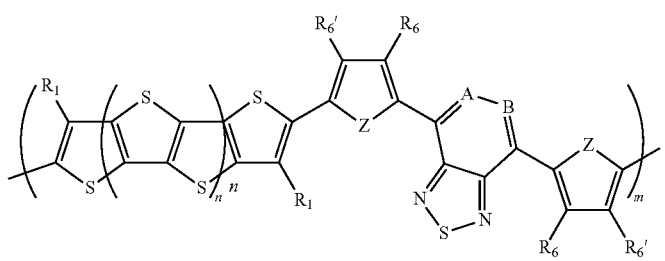

6

-continued

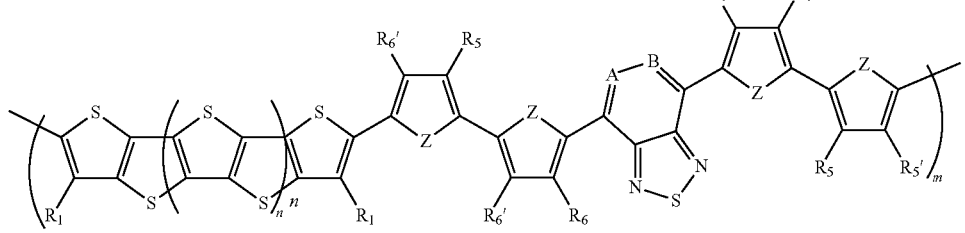

7

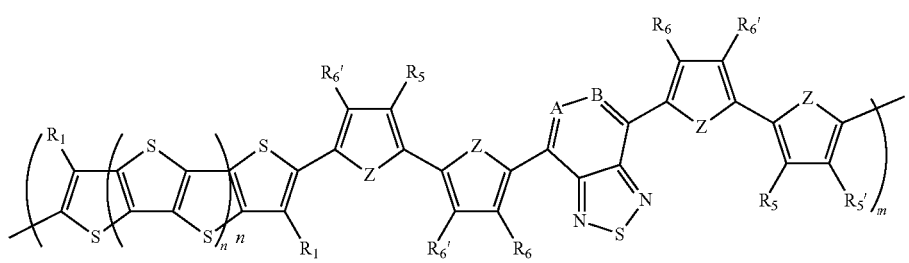

8 wherein each $R_1$ is independently, an optionally substituted, branched or unbranched alkyl or interrupted alkyl group, a halogen, an optionally substituted aryl or heteroaryl group, or an optionally substituted conjugated group; each $R_5$, $R_5'$, $R_6$, $R_6'$ is independently, hydrogen, an optionally substituted, branched or unbranched alkyl or interrupted alkyl group, a halogen, an optionally substituted aryl or heteroaryl group, or an optionally substituted conjugated group; A and B are N or C—$R_7$, where each $R_7$ is independently, hydrogen, halogen, or an optionally substituted, branched or unbranched alkyl or interrupted alkyl group; each Z is independently, NH, S, or O; n is an integer from 1-3; and m is an integer of 1 or more. In an aspect (2), the disclosure provides the polymer of aspect (1), wherein the compound comprises 5 or 6. In an aspect (3), the disclosure provides the polymer of aspect (1), wherein the compound comprises 7 or 8. In an aspect (4), the disclosure provides the polymer of any of aspects (1)-(3), wherein each $R_1$ is:

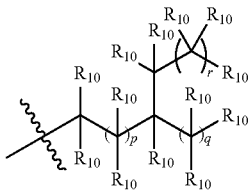

wherein each $R_{10}$ is independently, hydrogen, an aryl group, cycloalkyl group, aralkyl group, an alkenyl group, an alkynyl group, an amino group, an ester, an aldehyde, a hydroxyl group, an alkoxy group, a thiol group, a thioalkyl group, or a halide, an acyl halide, an acrylate, or a vinyl ether; and r, p, and q are integers of 2 or more. In an aspect (5), the disclosure provides the polymer of aspect (4), wherein each $R_{10}$ is hydrogen; p is an integer of 3 or more; and r and q are integers of 4 or more. In an aspect (6), the disclosure provides the polymer of aspect (5), wherein p is an integer of 6-8 and r and q are integers from 7-15. In an aspect (7), the disclosure provides the polymer of any of aspects (1)-(6), wherein at least one of $R_5$, $R_5'$, $R_6$, or $R_6'$ is an optionally substituted, branched or unbranched alkyl or interrupted alkyl group. In an aspect (8), the disclosure provides the polymer of any of aspects (1)-(7), wherein at least one of $R_6$, or $R_6'$ is an optionally substituted, branched or unbranched alkyl group. In an aspect (9), the disclosure provides the polymer of any of aspects (1)-(8), wherein $R_{6'}$ is

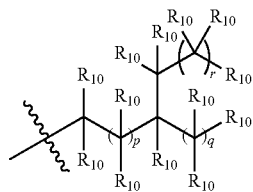

wherein each $R_{10}$ is independently, hydrogen and r, p, and q are integers of 2 or more. In an aspect (10), the disclosure provides the polymer of any of aspects (1)-(9), wherein each Z is S. In an aspect (11), the disclosure provides the polymer of any of aspects (1)-(10), wherein A and B are independently —C—H or N. In an aspect (12), the disclosure provides the polymer of any of aspects (1), (3)-(11), wherein the polymer is:

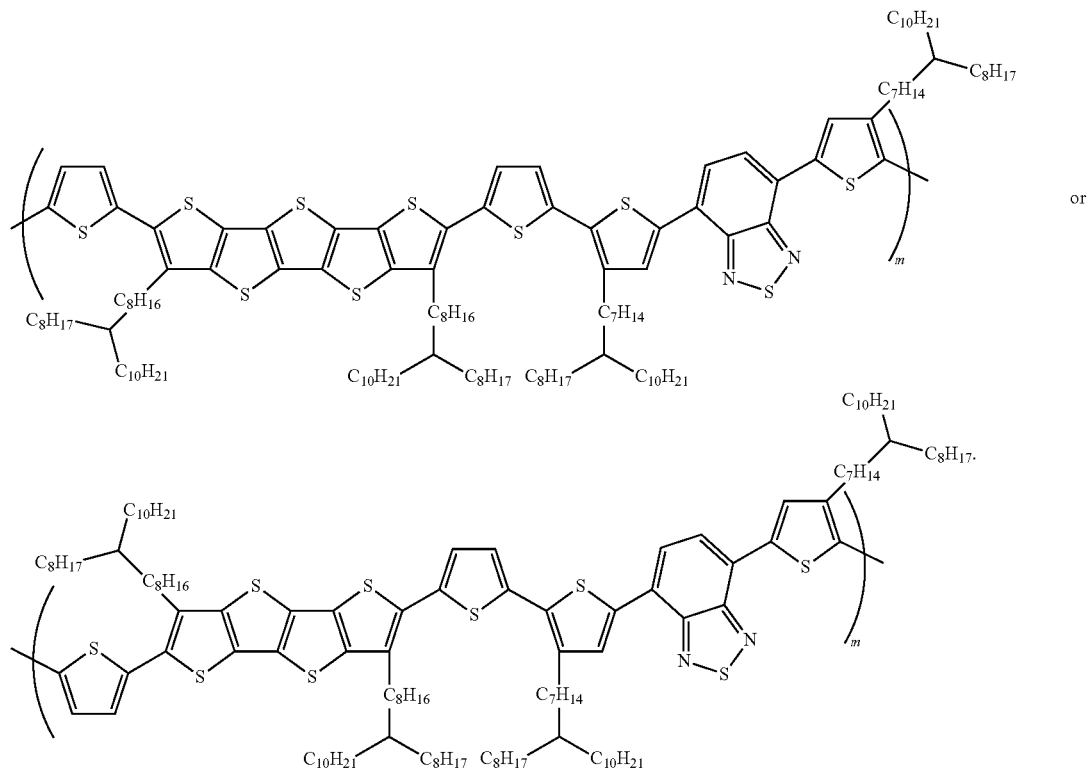
In an aspect (13), the disclosure provides the polymer of any of aspects (1)-(2), (4)-(11), wherein the polymer is:
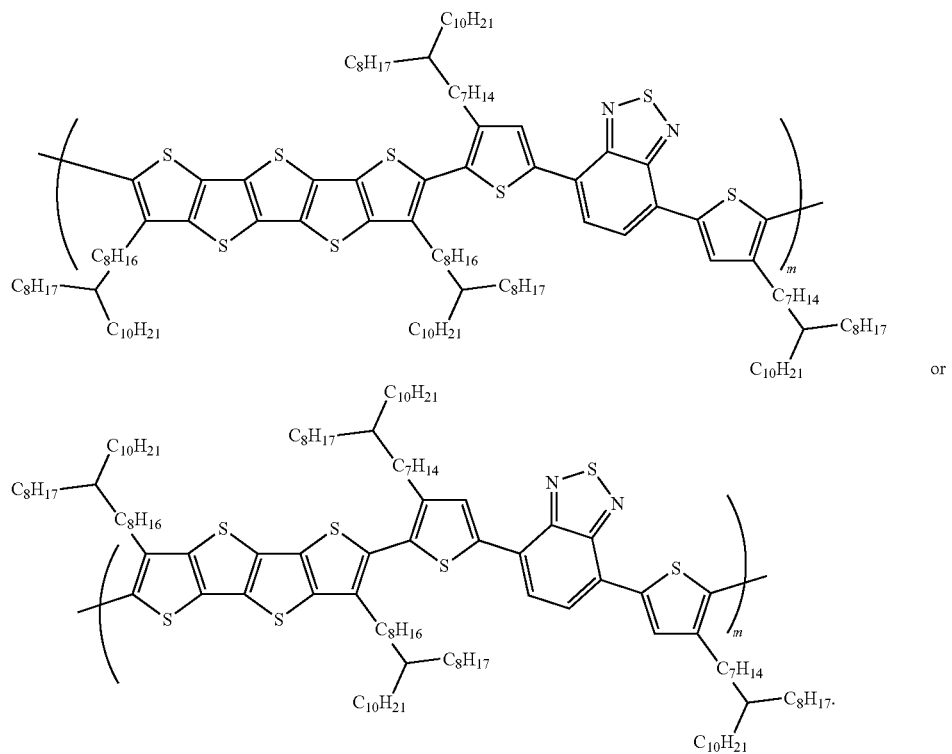
or In an aspect (14), the disclosure provides a method of making a polymer of any of aspects (1)-(13), wherein the method comprises reacting a first compound of structure 5', 6', 7', or 8':

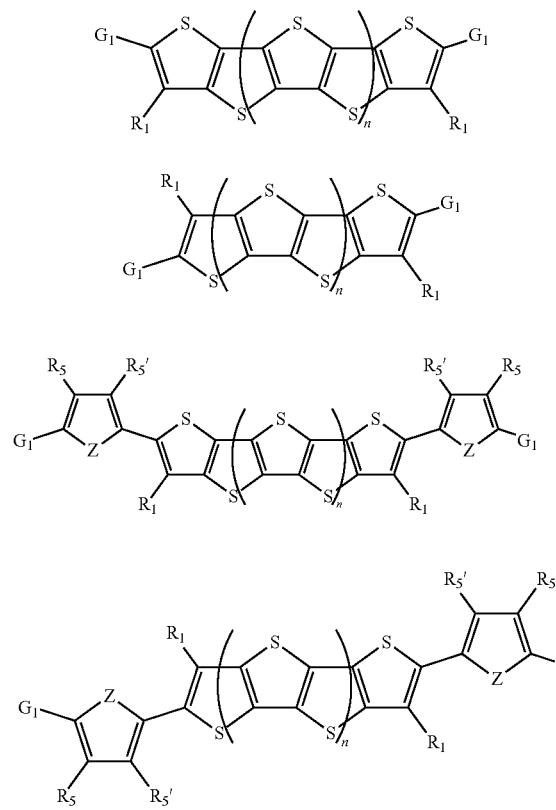

with a second compound of structure 9':

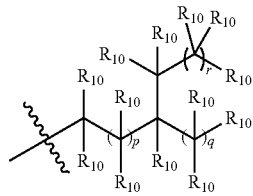

wherein each of $G_1$ and $G_2$ is a halogen or $Sn(R_8)_3$, where each $R_8$ is an alkyl, with the proviso that when $G_1$ is a halogen, $G_2$ is $Sn(R_8)_3$ and when $G_2$ is a halogen, $G_1$ is $Sn(R_8)_3$. In an aspect (15), the disclosure provides the method of aspect (14), wherein the first compound is 5' or 6'. In an aspect (16), the disclosure provides the method of aspect (14), wherein the first compound is 7' or 8'. In an aspect (17), the disclosure provides the method of any of aspects (14)-(16), wherein each $R_1$ is:

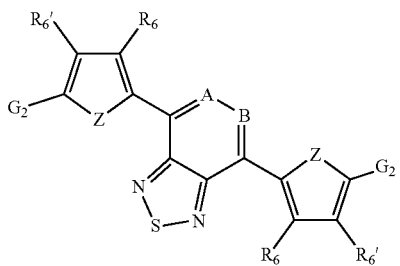

wherein each $R_{10}$ is independently, hydrogen, an aryl group, cycloalkyl group, aralkyl group, an alkenyl group, an alkynyl group, an amino group, an ester, an aldehyde, a hydroxyl group, an alkoxy group, a thiol group, a thioalkyl group, or a halide, an acyl halide, an acrylate, or a vinyl ether; and r, p, and q are integers of 2 or more. In an aspect (18), the disclosure provides the method of aspect (17), wherein each $R_{10}$ is hydrogen; p is an integer of 3 or more; and r and q are integers of 4 or more. In an aspect (19), the disclosure provides the method of aspect (18), wherein p is an integer of 6-8 and r and q are integers from 7-15. In an aspect (20), the disclosure provides the method of any of aspects (14)-(19), wherein at least one of $R_5$, $R_{5'}$, $R_6$, or $R_{6'}$ is an optionally substituted, branched or unbranched alkyl or interrupted alkyl group. In an aspect (21), the disclosure provides the method of any of aspects (14)-(20), wherein at least one of $R_6$, or $R_{6'}$ is an optionally substituted, branched or unbranched alkyl group. In an aspect (22), the disclosure provides the method of any of aspects (14)-(21), wherein $R_{6'}$ is

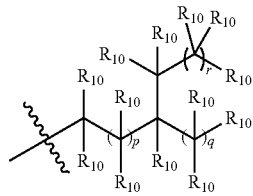

wherein each $R_{10}$ is independently, hydrogen and r, p, and q are integers of 2 or more. In an aspect (23), the disclosure provides the polymer of any of aspects (14)-(22), wherein each Z is S. In an aspect (24), the disclosure provides the polymer of any of aspects (14)-(23), wherein A and B are independently —C—H or N. In an aspect (25) the first compound is:

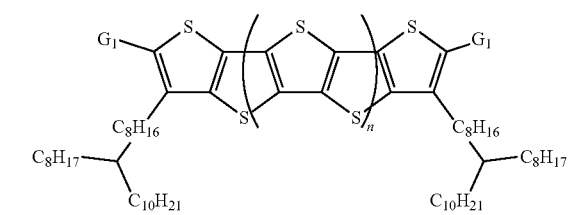

-continued

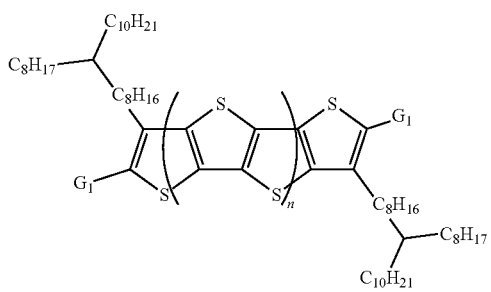

6' and
the second compound is:

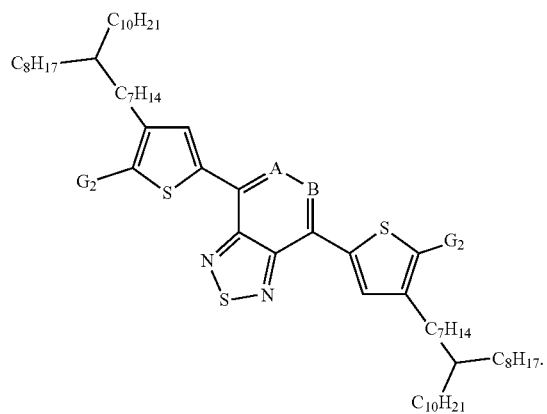

g'

In an aspect (26), the disclosure provides the method of aspect (25), wherein A and B are each N or C—H.

In an aspect (26) the first compound is:

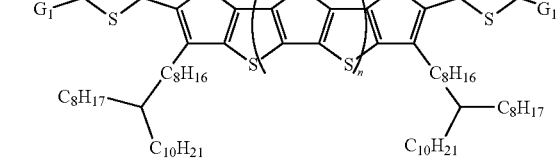

7'

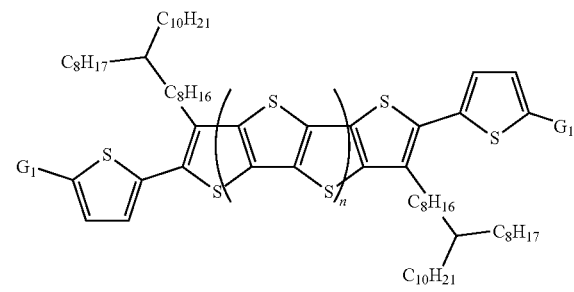

8' and
the second compound is:

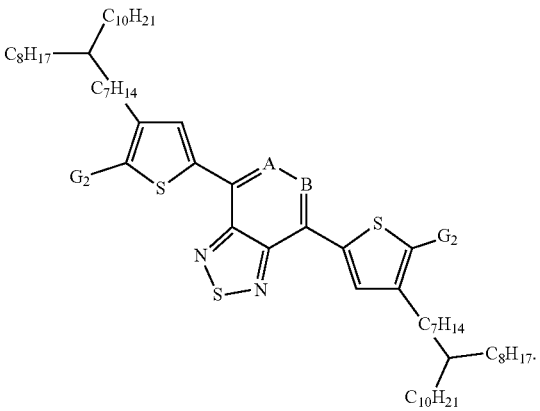

5 g'

In an aspect (28), the disclosure provides the method of aspect (27), wherein A and B are each N or C—H. In an aspect (29), the disclosure provides the method of any of aspects (14)-(28), wherein the reaction occurs in the presence of a catalyst. In an aspect (30), the disclosure provides the method of any of aspects (14)-(29), wherein the reaction occurs via a Stille-type reaction. In an aspect (31), the disclosure provides the method of aspect (29) or (30), wherein the catalyst comprises a transition metal.

Additional features and advantages will be set forth in the detailed description which follows, and in part will be readily apparent to those skilled in the art from the description or recognized by practicing the embodiments as described in the written description and claims hereof, as well as in the appended drawings.

It is to be understood that both the foregoing general description and the following detailed description are merely exemplary, and are intended to provide an overview or framework for understanding the nature and character of the invention.

BRIEF DESCRIPTION OF THE DRAWINGS

The accompanying drawings are included to provide a further understanding of the description, and are incorporated in and constitute a part of this specification. The drawings are not necessarily to scale, and sizes of various elements may be distorted for clarity. The drawings illustrate one or more embodiment(s) and together with the description serve to explain the principles and operation of the embodiments.

DETAILED DESCRIPTION

Figure 1:
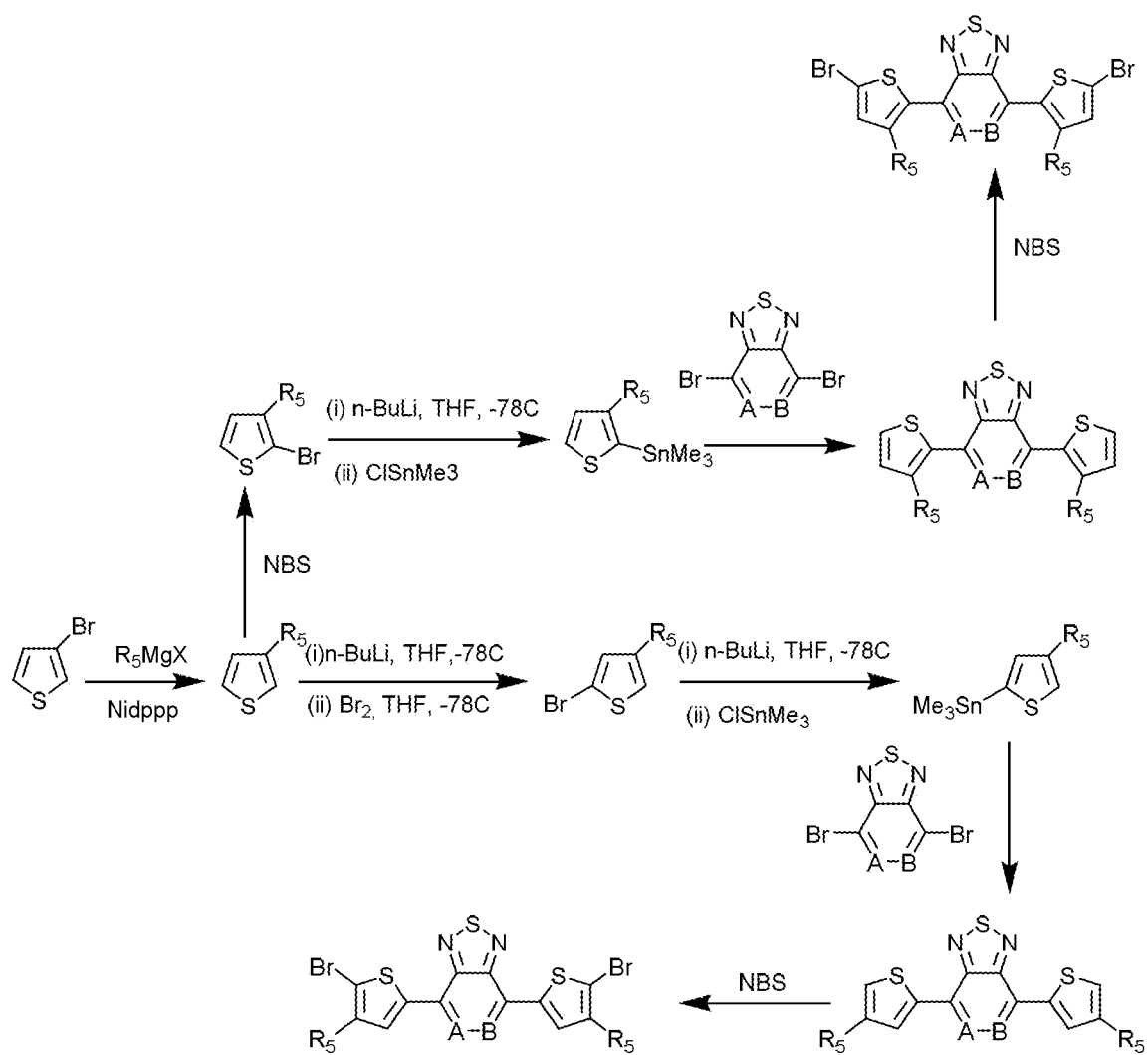
FIG. 1 describes multiple reaction schemes for forming polymerizable thiophene-substituted benzothiadiazoles.

Before the present materials, articles, and/or methods are disclosed and described, it is to be understood that the aspects described below are not limited to specific compounds, synthetic methods, or uses as such may, of course, vary. It is also to be understood that the terminology used herein is for the purpose of describing particular aspects only and is not intended to be limiting.

In this specification and in the claims that follow, reference will be made to a number of terms that shall be defined to have the following meanings:

Throughout this specification, unless the context requires otherwise, the word "comprise," or variations such as "comprises" or "comprising," will be understood to imply the inclusion of a stated integer or step or group of integers or steps but not the exclusion of any other integer or step or group of integers or steps.

It must be noted that, as used in the specification and the appended claims, the singular forms "a," "an" and "the" include plural referents unless the context clearly dictates otherwise. Thus, for example, reference to "a carrier" includes mixtures of two or more such carriers, and the like.

"Optional" or "optionally" means that the subsequently described event or circumstance may or cannot occur, and that the description includes instances where the event or circumstance occurs and instances where it does not.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed.

When the term "about" is used in describing a value or an end-point of a range, the disclosure should be understood to include the specific value or end-point referred to. When a numerical value or end-point of a range does not recite "about," the numerical value or end-point of a range is intended to include two embodiments: one modified by "about," and one not modified by "about." It will be further understood that the endpoints of each of the ranges are significant both in relation to the other endpoint, and independently of the other endpoint.

The term "alkyl group" as used herein may be a branched or unbranched saturated hydrocarbon group of 1 to 40 carbon atoms (or with a number of carbon atoms as defined by the nomenclature $C_\gamma$-$C_\zeta$, where $\gamma$ and $\zeta$ are a numerical values with $\gamma<\zeta$), such as methyl, ethyl, n-propyl, isopropyl, n-butyl, isobutyl, t-butyl, pentyl, hexyl, heptyl, octyl, decyl, or tetradecyl, and the like. The alkyl group may be substituted or unsubstituted. The term "unsubstituted alkyl group" is defined herein as an alkyl group composed of just carbon and hydrogen. The term "substituted alkyl group" is defined herein as an alkyl group with one or more hydrogen atoms substituted with a group including, but not limited to, an aryl group, cycloalkyl group, aralkyl group, an alkenyl group, an alkynyl group, an amino group, an ester, an aldehyde, a hydroxyl group, an alkoxy group, a thiol group, a thioalkyl group, or a halide, an acyl halide, an acrylate, or a vinyl ether. For example, the alkyl groups may be an alkyl hydroxy group, where any of the hydrogen atoms of the alkyl group are substituted with a hydroxyl group.

The term "alkyl group" as defined herein also includes cycloalkyl groups. The term "cycloalkyl group" as used herein is a non-aromatic carbon-based ring composed of at least 3 carbon atoms, and in some embodiments from 3 to 20 carbon atoms. Examples of cycloalkyl groups include, but are not limited to, cyclopropyl, cyclobutyl, cyclopentyl, cyclohexyl, etc. The term cycloalkyl group also includes a heterocycloalkyl group, where at least one of the carbon atoms of the ring may be substituted with a heteroatom such as, but not limited to, nitrogen, oxygen, sulfur, or phosphorus.

The term "interrupted alkyl group" as used herein is an alkyl group that has one or more non-carbon atoms, such as sulfur, oxygen, or nitrogen, in interspersed or interrupting the carbon chain, or has a carbon-carbon double or triple bond in the carbon chain. For example, —OCH$_3$, —OCH$_2$CH$_2$—O—C$_2$H$_5$, —SCH$_2$SC$_2$H$_5$, —C$_2$H$_4$OC$_2$H$_4$OCH$_3$, —CH$_2$CH=CHC$_2$H$_5$, —CHC=CC$_2$H$_5$, etc.

The term "aryl group" as used herein may be any carbon-based aromatic group, fused carbon-based aromatic group, including, but not limited to, benzene, naphthalene, etc. The term "aryl group" also includes "heteroaryl group," meaning an aromatic ring composed of at least three carbon atoms that has at least one heteroatom incorporated within the ring of the aromatic group. Examples of heteroatoms include, but are not limited to, nitrogen, oxygen, sulfur, and phosphorus. The aryl group may be substituted or unsubstituted. The aryl group may be substituted with one or more groups including, but not limited to, alkyl, alkynyl, alkenyl, aryl, halide, nitro, amino, ester, ketone, aldehyde, hydroxy, carboxylic acid, or alkoxy as defined herein. In some embodiments, the term "aryl group" may be limited to substituted or unsubstituted aryl and heteroaryl rings having from three to 30 carbon atoms.

The term "aralkyl" as used herein may be an aryl group having an alkyl group as defined above attached to the aryl group. An example of an aralkyl group may be a benzyl group.

The term "alkenyl group" is defined as a branched or unbranched hydrocarbon group of 2 to 40 carbon atoms and structural formula containing at least one carbon-carbon double bond.

The term "alkynyl group" is defined as a branched or unbranched hydrocarbon group of 2 to 40 carbon atoms and a structural formula containing at least one carbon-carbon triple bond.

The term "conjugated group" is defined as a linear, branched or cyclic group, or combination thereof, in which p-orbitals of the atoms within the group are connected via delocalization of electrons and wherein the structure may be described as containing alternating single and double or triple bonds and may further contain lone pairs, radicals, or carbenium ions. Conjugated cyclic groups may comprise one of or both aromatic and non-aromatic groups, and may comprise polycyclic or heterocyclic groups, such as diketopyrrolopyrrole. Ideally, conjugated groups are bound in such a way as to continue the conjugation between the thiophene moieties they connect. In some embodiments, "conjugated groups" may be limited to conjugated groups having three to 30 carbon atoms.

Disclosed are compounds, compositions, and components that may be used for, may be used in conjunction with, may be used in preparation of, or are products of the disclosed methods and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each may be specifically contemplated and described herein. Thus, if a class of molecules A, B, and C are disclosed as well as a class of molecules D, E, and F and an example of a combination molecule, A-D may be disclosed, then even if each is not individually recited, each may be individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these may be also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that may be performed it may be understood that each of these additional steps may be performed with any specific embodiment or combination of embodiments of the disclosed methods, and that each such combination may be specifically contemplated and should be considered disclosed.

Compounds

High performance semiconducting fused thiophene polymers have previously been developed. Dialkylated tetrathienoacene (FT4) OSC copolymers can be deposited from a dichlorobenzene solution to yield ordered films with a short π-π distance of 3.76 angstroms and with field-effect hole mobilities that exceeds 0.4 $cm^2 V^{-1} s^{-1}$. These polymers enable simple transistor fabrication at relatively low temperatures, which is particularly important for the realization of large-area, mechanically flexible electronics. Advances in this field have led to targeted design of donor-acceptor based polymer systems that show improved mobilities. Some of the most popular donor-acceptor organic semiconducting copolymers are diketopyrrolopyrrole (DPP)-based copolymers. Hole mobility values reported are up to 12 $cm^2 V^{-1} s^{-1}$ and electron mobility values reported are up to 3 $cm^2 V^{-1} s^{-1}$. Devices utilizing ambipolar polymer OTFTs containing donor-acceptor units have shown hole and electron mobility values of 6.30 $cm^2 V^{-1} s^{-1}$ and 2.78 $cm^2 V^{-1} s^{-1}$, respectively. Yet these polymers have suffered from issues of stability and solubility. There is a continued, unmet need to find organic semiconducting polymer systems that are stable and easily processable while retaining the high mobilities necessary to make them useful in next generation electronics.

The present disclosure goes beyond DPP based systems and combines stable fused thiophene (FTx, where x describes the number thiophenes in the fused structure) donor groups:

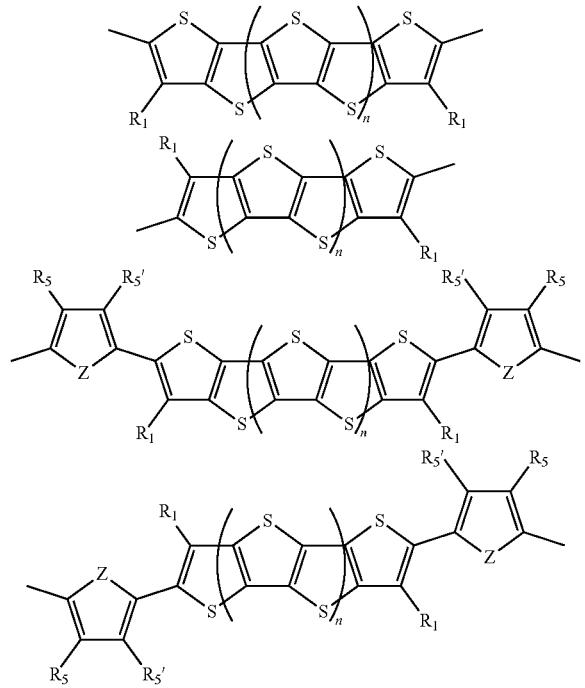

with new acceptors. The new acceptor groups are based on the generic Arylthiadiazole structure:

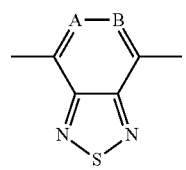

wherein A and B are N or C—$R_7$, and the variables Z, n, $R_1$, $R_5$, $R_{5'}$, and $R_7$ are detailed below. For example, the acceptor group can be a benzothiadiazole (BTD) or thiadiazolopyridine (TDP):

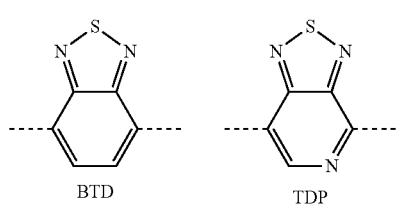

The polymers described herein have the advantageous properties of employing high efficiency electron acceptors in a highly conjugated polymer structure, higher molecular weights than have previously been achieved, and increased solubility. In some embodiments, the polymers have molecular weights of from about 30-80 kDa or 40-60 kDa.

The fused thiophene moieties described herein are substituted with optionally substituted alkyl groups at the β-positions of the fused thiophene ring system. As used herein, an α-position of a fused thiophene ring system may be a non-fused carbon center that may be directly adjacent to the sulfur of a fused thiophene, while a β-position may be a non-fused carbon center that may be separated from the sulfur of the fused thiophene by an α-position. In the structures described herein, the α-positions are shown as being connected to the rest of the composition, while the β-positions are substituted with $R_1$ groups linked to the β-positions by alkyl chains.

One aspect comprises a polymer comprising a repeat unit of formula 5, 6, 7, or 8:

gen, halogen, or an optionally substituted, branched or unbranched alkyl or interrupted alkyl group; each Z is independently, NH, S, or O; n is an integer from 1-3; and m is an integer of 1 or more.

In some embodiments, at least one of $R_1$, $R_5$, $R_{5'}$, $R_6$, $R_{6'}$, and $R_7$ may be a substituted or unsubstituted $C_4$, $C_5$, $C_6$, $C_7$, $C_8$, $C_9$, or $C_{10}$ or greater alkyl group. For example, at least one of $R_1$, $R_5$, $R_{5'}$, $R_6$, $R_{6'}$, and $R_7$ may be an optionally substituted $C_4$ or greater alkyl group. In such embodiments, the optionally substituted $C_4$ or greater alkyl group may be a straight-chain alkyl group (e.g. butyl, pentyl, hexyl, heptyl, octyl, nonyl, decyl, undecyl, dodecyl or hexadecyl), a

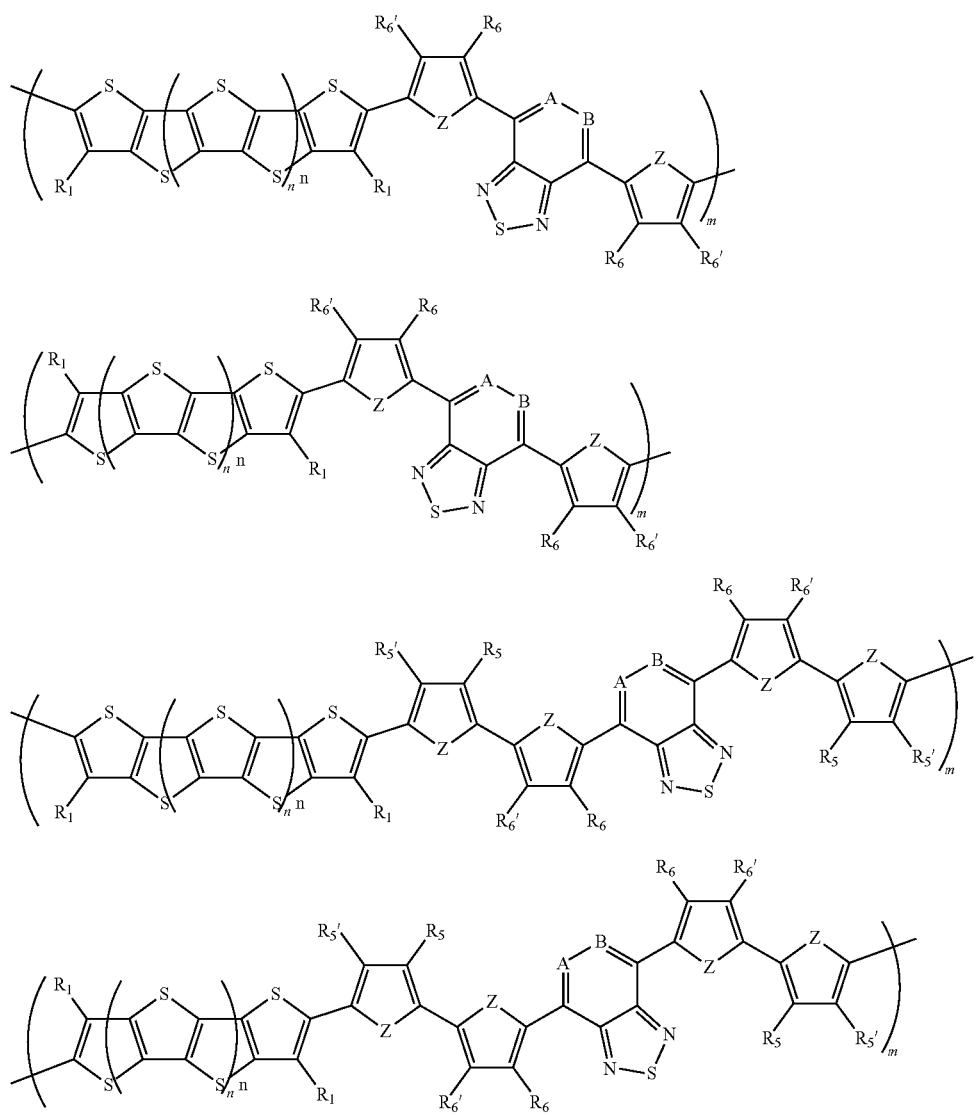

wherein each $R_1$ is independently, an optionally substituted, branched or unbranched alkyl or interrupted alkyl group, a halogen, an optionally substituted aryl or heteroaryl group, or an optionally substituted conjugated group; each $R_5$, $R_{5'}$, $R_6$, $R_{6'}$ is independently, hydrogen, an optionally substituted, branched or unbranched alkyl or interrupted alkyl group, a halogen, an optionally substituted aryl or heteroaryl group, or an optionally substituted conjugated group; A and B are N or C—$R_7$, where each $R_7$ is independently, hydrobranched alkyl group (e.g. sec-butyl, neo-pentyl, 4-methylpentyl), or a substituted or unsubstituted $C_5$ or greater cycloalkyl group (e.g. cyclopentyl, cyclohexyl). In some embodiments, $R_1$ comprises a branched, optionally substituted alkyl group having a total number of carbons of 10, 12, 14, 16, 18, 20, 22, 25, or greater. In some embodiments, the branch point of the $R_1$ branched, optionally substituted alkyl is at $C_5$, $C_6$, $C_7$, $C_8$, $C_9$, $C_{10}$ or greater. In some embodiments, at least one of $R_5$, $R_{5'}$, $R_6$, or $R_{6'}$ comprises a branched, optionally substituted alkyl group having a total number of carbons of 10, 12, 14, 16, 18, 20, 22, 25, or greater. In some embodiments, the branch point of the $R_5$, $R_{5'}$, $R_6$, or $R_{6'}$ branched, optionally substituted alkyl is at $C_5$, $C_6$, $C_7$, $C_8$, $C_9$, $C_{10}$ or greater. In some embodiments, both $R_1$ and at least one of $R_5$, $R_{5'}$, $R_6$, or $R_{6'}$ comprise branched, optionally substituted alkyl groups having a total number of carbons of 10, 12, 14, 16, 18, 20, 22, 25, or greater. In some embodiments, the branch point of both the $R_1$ and the at least one of $R_5$, $R_{5'}$, $R_6$, or $R_{6'}$ branched, optionally substituted alkyl is at $C_5$, $C_6$, $C_7$, $C_8$, $C_9$, $C_{10}$ or greater.

In particular, in some embodiments, both $R_1$ and at least one of $R_6$, or $R_{6'}$ comprise branched, unsubstituted alkyl groups having a total number of carbons of 18, 20, 22, 25, or greater. In such embodiments, the branch point of both the $R_1$ and the at least one of $R_6$, or $R_{6'}$ branched, unsubstituted alkyl is at $C_7$, $C_8$, $C_9$, $C_{10}$ or greater. In substituted embodiments of $R_1$, $R_5$, $R_{5'}$, $R_6$, or $R_{6'}$, each group may be substituted with one or more amino, ester, aldehyde, hydroxyl, alkoxy, thiol, thioalkyl, halide, acyl halide, acrylate, or vinyl ether moieties or any combination of two or more of these. The selection of $R_1$, $R_5$, $R_{5'}$, $R_6$, and $R_{6'}$ may depend on the end use of the moiety-containing composition. The methods described herein permit the synthesis of compositions having a wide variety of $R_1$, $R_5$, $R_{5'}$, $R_6$, and $R_{6'}$ substituents. Any functionality on a substituted alkyl group may also be protected in order to survive subsequent reaction steps.

Specific examples of $R_1$, $R_5$, $R_{5'}$, $R_6$, and $R_{6'}$ may include:

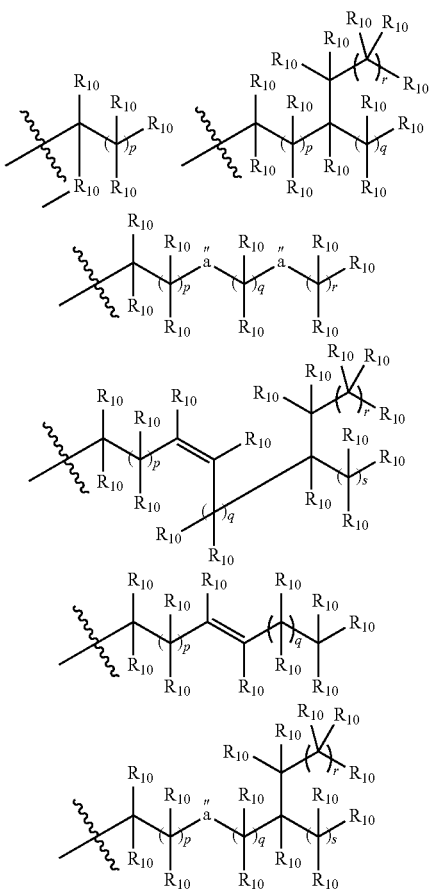

-continued

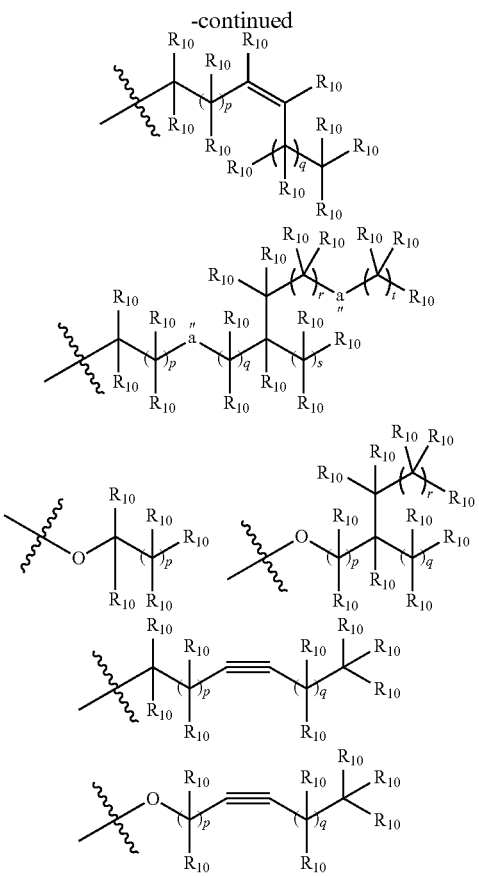

wherein each $R_{10}$ is independently, hydrogen, an aryl group, cycloalkyl group, aralkyl group, an alkenyl group, an alkynyl group, an amino group, an ester, an aldehyde, a hydroxyl group, an alkoxy group, a thiol group, a thioalkyl group, or a halide, an acyl halide, an acrylate, or a vinyl ether; r, p, q, and t are integers of 2 or more, and each a" is independently $CR_{10}R_{10}$, N, O, S, or Si.

In some embodiments, n is an integer of 1 or greater. In some embodiments, n is an integer from 1 to 4, 1 to 3, or 1 to 2. In one aspect, m may be from 1 to 10,000, 1 to 9,000, 1 to 8,000, 1 to 7,000, 1 to 6,000, 1 to 5,000, 1 to 4,000, 1 to 3,000, 1 to 2,000, 1 to 1,000, 1 to 500, 1 to 250, 1 to 100, 1 to 50, 1 to 25, 1 to 10, 25 to 1000, 25 to 500, 25 to 250, 50 to 1000, 50 to 500, or 50 to 250.

In some embodiments, A and B are each independently, N or C—$R_7$. Each $R_7$ is hydrogen, halogen, or an optionally substituted, branched or unbranched alkyl or interrupted alkyl group. In some embodiments, A is N and B is C—$R_7$. In some embodiments, B is N and A is C—$R_7$. In some embodiments, A and B are both C—$R_7$. In some embodiments, $R_7$ is a halogen, a $C_1$-$C_3$ alkyl, or hydrogen. In some embodiments, $R_7$ is hydrogen.

The fused thiophene moieties described in 5-8 may have any number of fused rings above 3. For example, the fused thiophene moieties may be tetracyclic (6 & 8, n=1); pentacyclic (5 & 7, n=1), hexacyclic (6 & 8, n=2); or heptacyclic (5 & 7, n=2). The methods described herein permit the construction of fused thiophene moieties having any desired number of rings. In one aspect, for 5-8, n may be 1, 2, 3, 4, 5, 6, or 7.

An unexpected advantage of the embodied compounds described herein is that the presence of at least four long alkyl chains on the polymer provides improved mobility and processability properties. In some embodiments, the presence of two branched alkyl chains with branching points at the $C_4$ position or greater on the fused thiophene provides improved mobility and processability properties. In some embodiments, the presence of two branched alkyl chains with branching points at the $C_4$ position or greater on the fused thiophene in combination with two branched alkyl chains with branching points at the $C_4$ position or greater on the thiophene linkers provides improved mobility and processability properties. Additionally, the embodied polymers shown in 5-8 can have higher field effect hole mobility than current high performance polymers.

While it was expected that the large, branched alkyl chains would inhibit stacking or structured organization of the polymer, these potential issues were not observed. Rather, it is hypothesized that the embodied polymers provide superior properties because 1) since all branched alkyl chains are at least four carbons away from the main polymer backbone, there is no or very low steric effect from them to cause the twisting of the original planarity of the polymer backbone, which would interfere with the π-stacking of the polymer backbones, and 2) the existence of four large, nonpolar branched side chains in one polymer repeat unit significantly increases the solubility of these polymers and thus allow for an increase in the molecular weight of the polymers, which may result in an enhanced mobility over current high performance polymers. In some embodiments, the polymers have molecular weights of from about 30-80 kDa or 40-60 kDa.

One advantage of the increased solubility of the specific polymers disclosed herein is that they can be synthesized by advanced flow reactor techniques, which often can produce higher molecular weight polymers with tighter weight distribution. Additionally, in some non-limiting embodiments, the fused thiophenes ($FT_4$) may be in liquid form at temperatures as low as 10° C., 5° C., 0° C., −5° C., or −10° C. Previously made polymers generally have limited solubility in various solvents and may be difficult to process, e.g., when preparing printed electronics, without negatively impacting electronic performance. The embodied FT4 monomers may satisfy these requirements since branched side-chain FT4 may be used to construct a larger conjugation system with less worry about solubility limitations.

Example embodiments of the compounds described herein may be found in TABLE 1:

TABLE 1

| # | Structure | $R_1$ | $R_5$ | $R_{5'}$ | $R_6$ |
|---|---|---|---|---|---|
| 1 | 5 or 6 | $C_4H_8CHC_8H_{17}C_{10}H_{21}$ | — | — | H |
| 2 | 5 or 6 | $C_5H_{10}CHC_8H_{17}C_{10}H_{21}$ | — | — | $C_4H_9$ |
| 3 | 5 or 6 | $C_6H_{12}CHC_8H_{17}C_{10}H_{21}$ | — | — | H |
| 4 | 5 or 6 | $C_7H_{14}CHC_8H_{17}C_{10}H_{21}$ | — | — | $CH_3$ |
| 5 | 5 or 6 | $C_8H_{16}CHC_8H_{17}C_{10}H_{21}$ | — | — | H |
| 6 | 5 or 6 | $OC_4H_8CHC_8H_{17}C_{10}H_{21}$ | — | — | H |
| 7 | 5 or 6 | $OC_4H_8CHC_8H_{17}C_{10}H_{21}$ | — | — | $C_5H_{10}CHC_8H_{17}C_{10}H_{21}$ |
| 8 | 5 or 6 | $C_8H_{16}CHC_8H_{17}C_{10}H_{21}$ | — | — | $C_6H_{12}CHC_8H_{17}C_{10}H_{21}$ |
| 9 | 5 or 6 | $C_7H_{14}CHC_8H_{17}C_{10}H_{21}$ | — | — | $C_7H_{14}CHC_8H_{17}C_{10}H_{21}$ |
| 10 | 5 or 6 | $C_8H_{16}CHC_8H_{17}C_{10}H_{21}$ | — | — | $C_8H_{16}CHC_8H_{17}C_{10}H_{21}$ |
| 11 | 5 or 6 | $C_8H_{16}CHC_8H_{17}C_{10}H_{21}$ | — | — | $OC_4H_8CHC_8H_{17}C_{10}H_{21}$ |
| 12 | 7 or 8 | $C_8H_{16}CHC_8H_{17}C_{10}H_{21}$ | H | H | H |
| 13 | 7 or 8 | $C_6H_{12}CHC_8H_{17}C_{10}H_{21}$ | H | H | $C_4H_9$ |
| 14 | 7 or 8 | $C_7H_{14}CHC_8H_{17}C_{10}H_{21}$ | $C_4H_9$ | H | H |
| 15 | 7 or 8 | $C_8H_{16}CHC_8H_{17}C_{10}H_{21}$ | H | H | H |
| 16 | 7 or 8 | $C_5H_{10}CHC_8H_{17}C_{10}H_{21}$ | $C_6H_{12}CHC_8H_{17}C_{10}H_{21}$ | H | H |
| 17 | 7 or 8 | $C_6H_{12}CHC_8H_{17}C_{10}H_{21}$ | H | $C_7H_{14}CHC_8H_{17}C_{10}H_{21}$ | H |
| 18 | 7 or 8 | $C_7H_{14}CHC_8H_{17}C_{10}H_{21}$ | H | H | $C_7H_{14}CHC_8H_{17}C_{10}H_{21}$ |
| 19 | 7 or 8 | $C_8H_{16}CHC_8H_{17}C_{10}H_{21}$ | $C_7H_{14}CHC_8H_{17}C_{10}H_{21}$ | H | H |
| 20 | 7 or 8 | $OC_4H_8CHC_8H_{17}C_{10}H_{21}$ | H | H | H |
| 21 | 7 or 8 | $C_7H_{14}CHC_8H_{17}C_{10}H_{21}$ | H | $C_7H_{14}CHC_8H_{17}C_{10}H_{21}$ | $C_7H_{14}CHC_8H_{17}C_{10}H_{21}$ |
| 22 | 7 or 8 | $C_8H_{16}CHC_8H_{17}C_{10}H_{21}$ | $C_7H_{14}CHC_8H_{17}C_{10}H_{21}$ | H | $C_7H_{14}CHC_8H_{17}C_{10}H_{21}$ |

| # | $R_{6'}$ | Z | A | B | n |
|---|---|---|---|---|---|
| 1 | $OC_4H_8CHC_8H_{17}C_{10}H_{21}$ | S | N | CH | 1 or 2 |
| 2 | $C_6H_{12}CHC_8H_{17}C_{10}H_{21}$ | N | CH | N | 1 or 2 |
| 3 | $C_7H_{14}CHC_8H_{17}C_{10}H_{21}$ | S | CH | CH | 1 or 2 |
| 4 | $C_8H_{16}CHC_8H_{17}C_{10}H_{21}$ | S | N | CH | 1 or 2 |
| 5 | $C_7H_{14}CHC_8H_{17}C_{10}H_{21}$ | S | CH | CH | 1 or 2 |
| 6 | H | S | CH | CH | 1 or 2 |
| 7 | $C_4H_9$ | S | N | CH | 1 or 2 |
| 8 | H | N | N | CH | 1 or 2 |
| 9 | $CH_3$ | S | CH | CH | 1 or 2 |
| 10 | H | N | N | N | 1 or 2 |
| 11 | H | S | CH | N | 1 or 2 |
| 12 | $C_7H_{14}CHC_8H_{17}C_{10}H_{21}$ | S | CH | CH | 1 or 2 |
| 13 | $OC_4H_8CHC_8H_{17}C_{10}H_{21}$ | S | CH | CH | 1 or 2 |
| 14 | $C_7H_{14}CHC_8H_{17}C_{10}H_2$ | N | CH | CH | 1 or 2 |
| 15 | $C_7H_{14}CHC_8H_{17}C_{10}H_{21}$ | S | N | CH | 1 or 2 |
| 16 | $C_7H_{14}CHC_8H_{17}C_{10}H_2$ | N | N | CH | 1 or 2 |
| 17 | $OC_4H_8CHC_8H_{17}C_{10}H_{21}$ | S | N | CH | 1 or 2 |
| 18 | $C_8H_{16}CHC_8H_{17}C_{10}H_{21}$ | S | CH | CH | 1 or 2 |
| 19 | $C_6H_{12}CHC_8H_{17}C_{10}H_{21}$ | S | CH | CH | 1 or 2 |
| 20 | $C_7H_{14}CHC_8H_{17}C_{10}H_{21}$ | N | N | N | 1 or 2 |
| 21 | $C_8H_{16}CHC_8H_{17}C_{10}H_{21}$ | N | N | N | 1 or 2 |
| 22 | $C_5H_{10}CHC_8H_{17}C_{10}H_{21}$ | S | CH | N | 1 or 2 |

Methods

Another aspect comprises methods of making the compounds, monomers, and polymers described herein. Methods of making fused thiophene-based structures may be found in U.S. application Ser. No. 13/665,055, filed Oct. 31, 2012, U.S. application Ser. No. 12/905,667, filed Oct. 15, 2010, U.S. application Ser. No. 12/935,426, filed Sep. 29, 2010, U.S. application Ser. No. 12/851,998, filed Aug. 6, 2010, U.S. application Ser. No. 13/397,021, filed Feb. 15, 2012, U.S. application Ser. No. 13/660,529, filed Oct. 25, 2012, and U.S. Pat. Nos. 7,705,108, 7,838,623, 8,389,669, 7,893,191, 8,349,998, 7,919,634, 8,278,410, and 8,217,183, all of which are incorporated herein by reference in their entirety.

Figure 2:
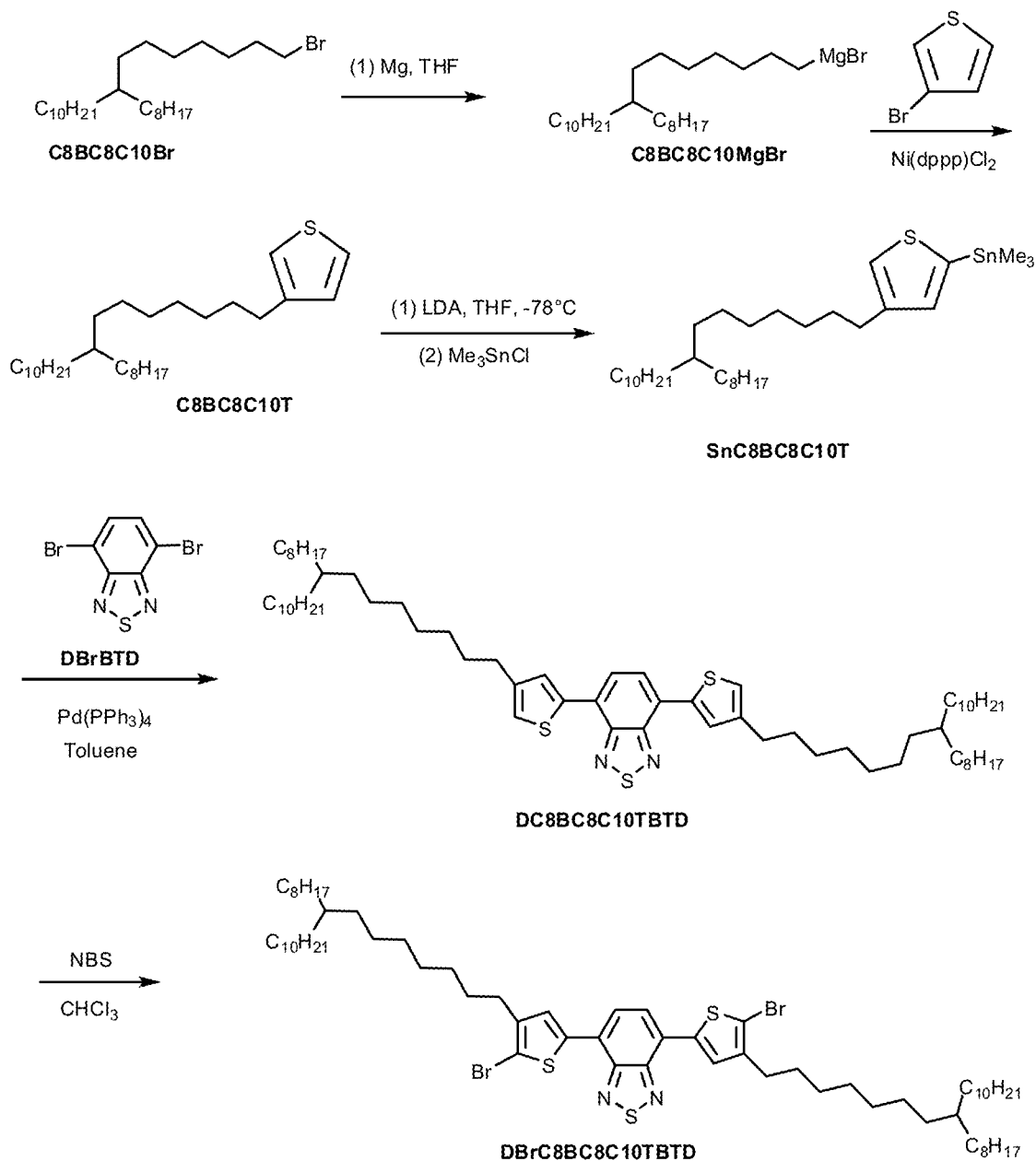
FIG. 2 describes an alternative reaction schemes for forming polymerizable thiophene-substituted benzothiadiazoles, where the example provided is 4,7-bis(5-bromo-4-(8-octyloctadecyl)thiophen-2-yl)benzo[c][1,2,5]thiadiazole (DBrC8BC8C10TBTD).

FIGS. 1 and 2 provide synthetic routes to producing the arylthiadiazoles described herein. Using the synthetic route shown in FIG. 1, side chain $R_5$ groups may be introduced to the intervening thiophenes between the FT4 and the arylthiadiazole. The additional $R_5$ groups increase the solubility of these materials, and provide alternative synthetic designs that lend flexibility to the overall structure by not having to rely solely on the solubilizing power of the alkyl chain substituents of the fused thiophene moiety. FIG. 2 provides an alternative synthetic route to a specific embodiment, DBrC8BC8C10TBTD.

In one aspect, compounds comprising the moiety 5-8 may be produced by reacting a compound comprising 9' with a compound comprising 5'-8'. In one embodiment, the method for making a compound, such as 5-8, may be carried out by providing a monomer comprising a moiety of structure 9':

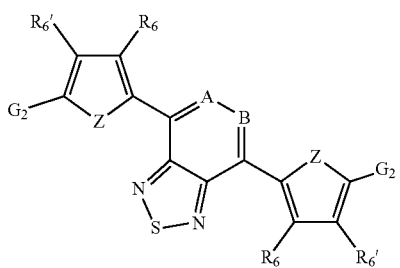

wherein A, B, Z, $R_6$, and $R_{6'}$ are as listed above for 5-8 and $G_2$ is a halogen or $Sn(R_8)_3$, where each $R_8$ is an alkyl.

The method of making the compound may be further carried out by providing a fused thiophene compound comprising a moiety of structure 5'-8'

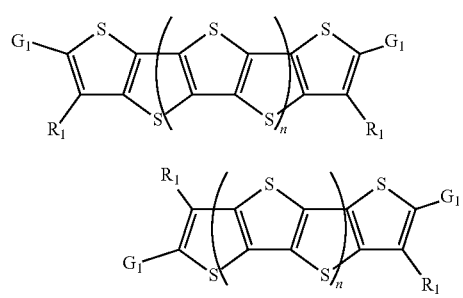

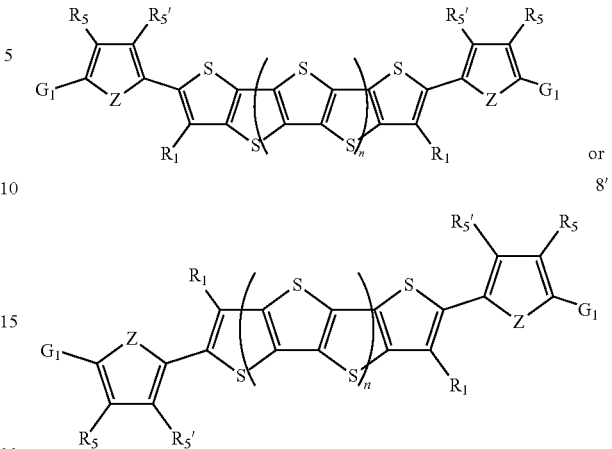

wherein n, $R_1$, $R_5$, $R_{5'}$, and Z, are as defined above for formulas 5-8, and $G_1$ is a halogen or $Sn(R_8)_3$, where each $R_8$ is an alkyl, with the proviso that when $G_1$ is a halogen, $G_2$ is $Sn(R_8)_3$ and when $G_2$ is a halogen, $G_1$ is $Sn(R_8)_3$. Each $G_1$ and $G_2$ may also be alternative groups, known or unknown, useful for Suzuki or Stille coupling.

Fused thiophene and oxidized fused thiophene oligomers and polymers may be prepared using methodologies similar to those used in making oligo- and poly(thiophenes) described above. For example, α,α'-dihydro fused thiophene moieties may be oxidatively oligomerized or polymerized using iron (III) compounds (e.g., $FeCl_3$, $Fe(acac)_3$), or may be brominated and coupled in an organomagnesium mediated reaction. The fused thiophene moieties and oxidized fused thiophene moieties described herein may be incorporated into other conjugated polymers such as, for example phenylene, vinylene, and acetylene copolymers, using coupling reactions familiar to the skilled artisan. The fused thiophene moieties and oxidized fused thiophene moieties described herein may be incorporated into other main chain and side chain polymers using techniques known in the art. It is contemplated that the fused thiophene compound may be oxidized prior to incorporation into an oligomer or polymer. In the alternative, the fused thiophene compound may be incorporated into the oligomer or polymer followed by oxidation.

Examples

The following examples are put forth so as to provide those of ordinary skill in the art with a complete disclosure and description of how the materials, articles, and methods described and claimed herein are made and evaluated, and are intended to be purely exemplary and are not intended to limit the scope of the description. Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, desired solvents, solvent mixtures, temperatures, pressures and other reaction ranges and conditions that may be used to optimize the product purity and yield obtained from the described process. Only reasonable and routine experimentation will be required to optimize such process conditions.

The specific example materials, P2TBTD2TDC9BC8C10FT4 and PTBTDTDC9BC8C10FT4:

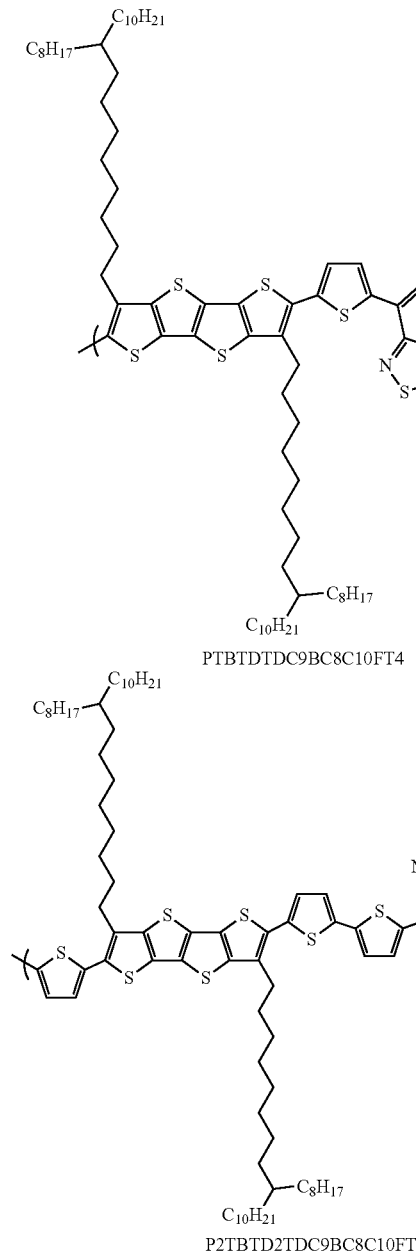

PTBTDTDC9BC8C10FT4

Figure 3:
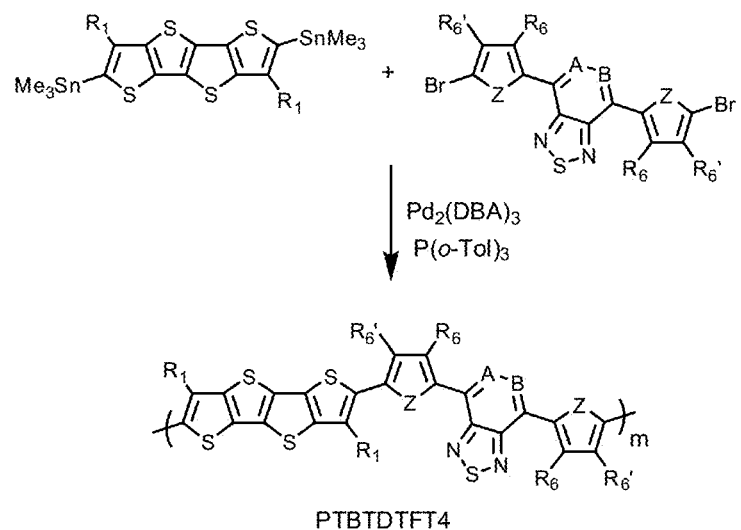
FIG. 3 shows a Stille coupling synthesis of arylthiadiazole-fused thiophene polymers. In the figure, FT4 is shown, but the reaction scheme is equally valid for other fused thiophene of the present disclosure.

P2TBTD2TDC9BC8C10FT4 can be synthesized by the general procedure disclosed in FIG. 3. The monomers and catalyst materials are weighed into a flask and the solvent (m-xylene) added. The polymerization is then carried out at 125° C. for 1 h. The material is then precipitated, filtered, dried then extracted in a soxhlet to remove any residual monomers and catalyst species. Finally, the polymer is dissolved from the soxhlet, reprecipitated and dried under vacuum. The detailed synthetic procedure is given here for PTBTDTDC9BC8C10FT4 as an example.

Synthesis of OSC copolymer poly[(3,7-bis(9-octylnonadecyl)thieno[3,2-b]thieno[2',3':4,5]thieno[2,3-d]thiophene-2,6-diyl)alt(4,7-bis(thiophen-2-yl)benzo[c][1,2,5]thiadiazole-5,5'-diyl)] (PTBTDTDC9BC8C10FT4):

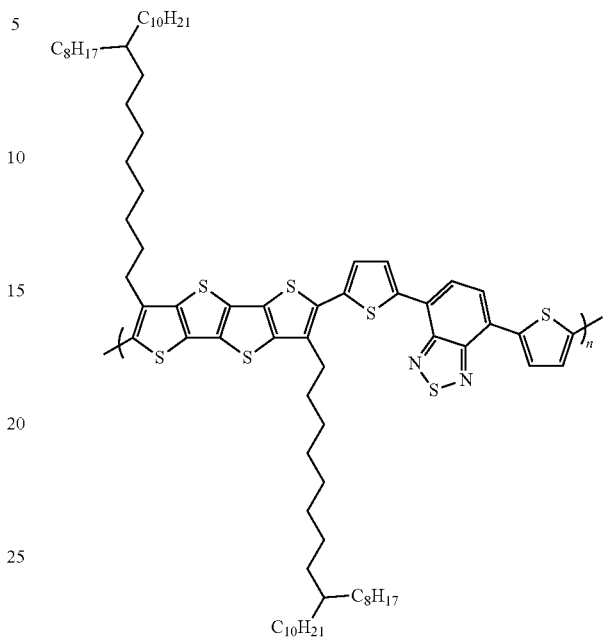

Monomer 2,6-bis(trimethylstannyl)-3,7-bis(9-octylnonadecyl)thieno[3,2-b]thieno [2',3':4,5] thieno[2,3-d]thiophene 1.109 g (0.739 mmol, MW 1499.96), monomer 4,7-bis(5-bromothiophen-2-yl)benzo[c][1,2,5]thiadiazole 0.339 g (0.739 mmol, MW 458.2), and catalyst tris(dibenzylideneacetone)dipalladium(0) 13.5 mg (0.0148 mmol) with o-tolyl phosphine 17.5 mg (0.0575 mmol) are weighed into a round bottom flask (100 mL). m-Xylene (30 mL) and a stir bar are added. A condenser is fitted and the reaction mixture is lowered into a pre-heated oil bath at 125° C. and heated under nitrogen for 1 h. The mixture is then poured into a stirring mixture of methanol and acetylacetone (200 mL+200 mL). Hydrochloric acid (2 mL, 35% aq) is added and the mixture is stirred for 16 h. The mixture is filtered and the polymer placed into a soxhlet thimble. The polymer is extracted in a soxhlet apparatus with acetone (250 mL) for 24 h, then hexanes (250 mL) for 24 h. The polymer is then extracted from the soxhlet apparatus into chloroform (250 mL). The chloroform solution is poured into methanol (400 mL) with rapid stirring, followed by moderate stirring for 20 min. The polymer is then filtered from the mixture and dried under vacuum to give the product as a purple solid.

The molecular weights of embodied polymers are given in TABLE 2. These weights are determined using an Agilent GPC220 run at 200° C. with 1,2,4-trichlorobenzene as the mobile phase, flowing at 1 mL/min. The column used is a Resipore 300×7.5 mm column. A refractive index detector, previously calibrated against polystyrene standards in the range 10000 to 240000, is used to determine the molecular weights.

TABLE 2

|  | Mn | Mw | PDI |
| --- | --- | --- | --- |
| PTBTDTDC9BC8C10FT4 | 38000 | 73500 | 1.94 |
| P2TBTD2TDC9BC8C10FT4 | 47000 | 144400 | 3.07 |

Figure 4:
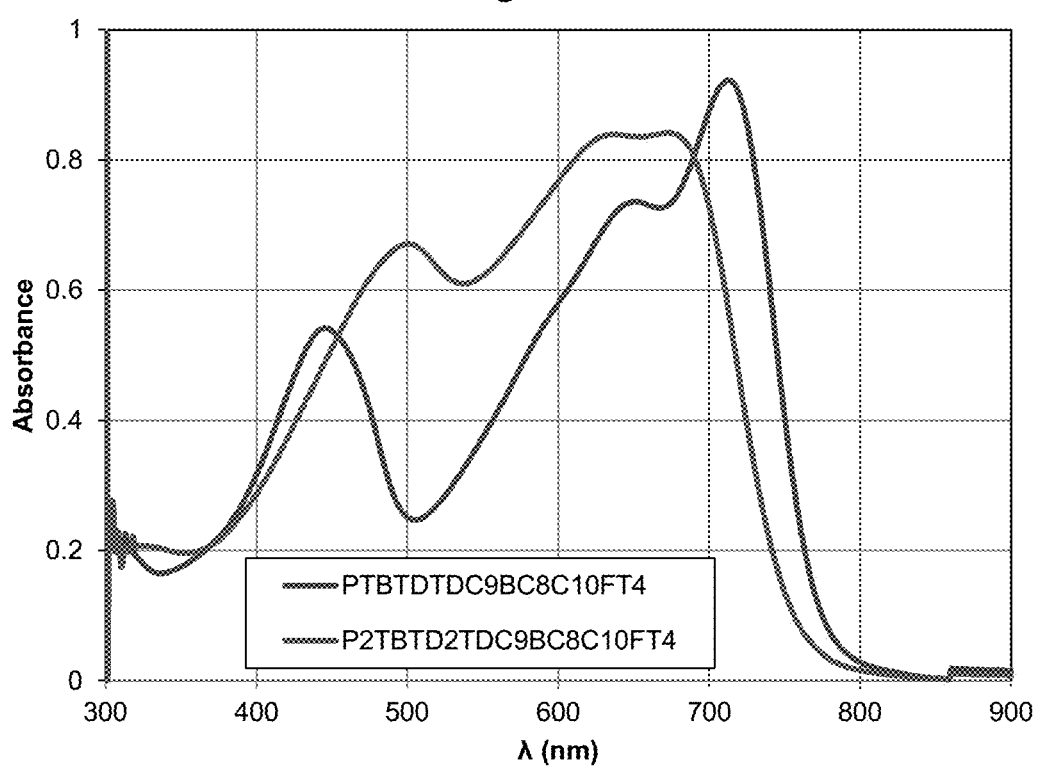
FIG. 4 presents ultraviolet-visible spectra of benzothiadiazole fused thiophene polymers described herein. The compounds shown are Poly[(3,7-bis(9-octylnonadecyl)thieno[3,2-b]thieno[2',3':4,5]thieno[2,3-d]thiophene-2,6'-diyl)alt(4,4'-bis(thiophen-2-yl)benzo[c][1,2,5]thiadiazole-5,5'-diyl)] ("PTBTDTDC9BC8C10FT4") and Poly[(2,6-dithienyl-3,7-bis(9-octylnonadecyl)thieno[3,2-b]thieno[2',3':4,5]thieno[2,3-d]thiophene-5,5'-diyl)alt(4,4'-bis(thiophen-2-yl)benzo[c][1,2,5]thiadiazole-5,5'-diyl)] ("P2TBTD2TDC9BC8C10FT4").

The UV-visible spectra of these two polymers are shown in FIG. 4.
The invention claimed is:
1. A compound selected from:
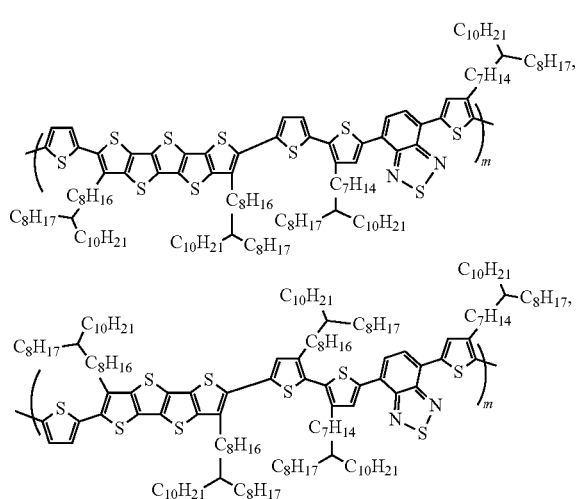
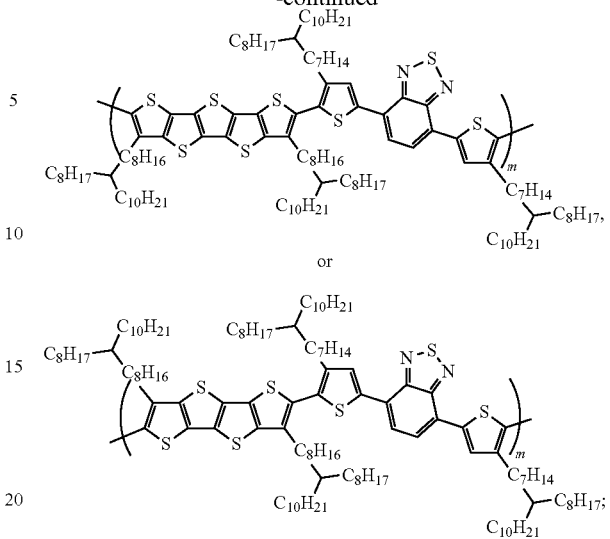
wherein m is an integer of 1 or more.
2. The compound of claim 1, wherein the compound is:
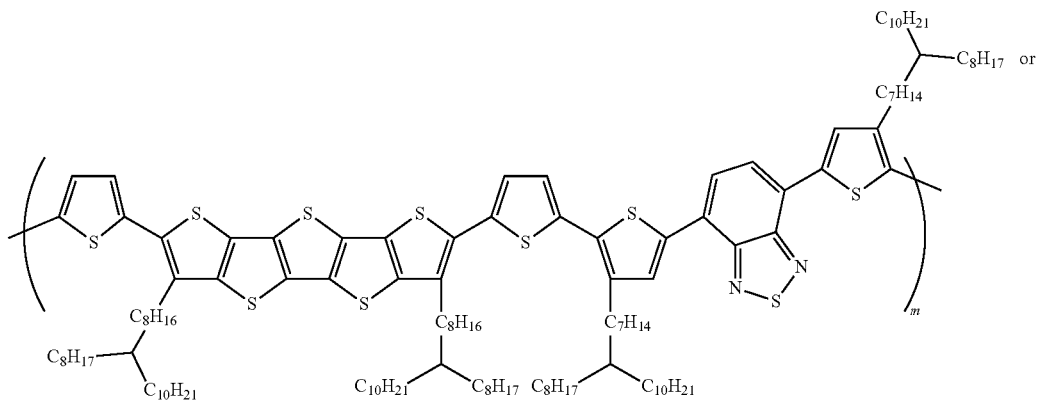
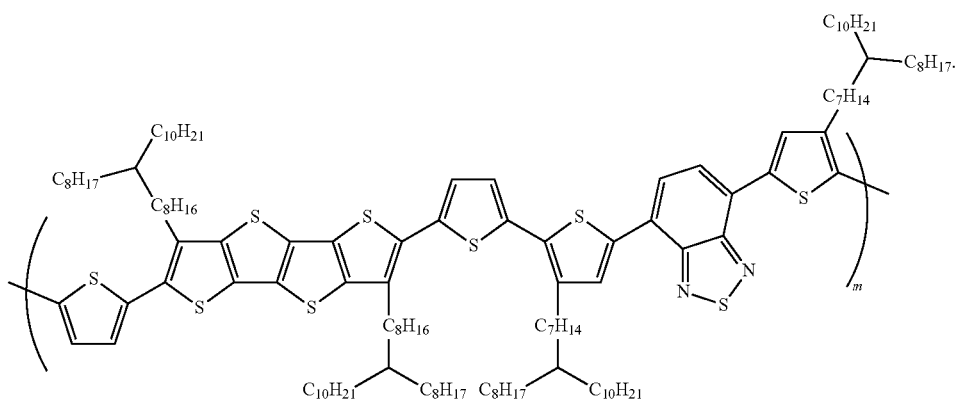

3. The compound of claim 1, wherein the compound is:
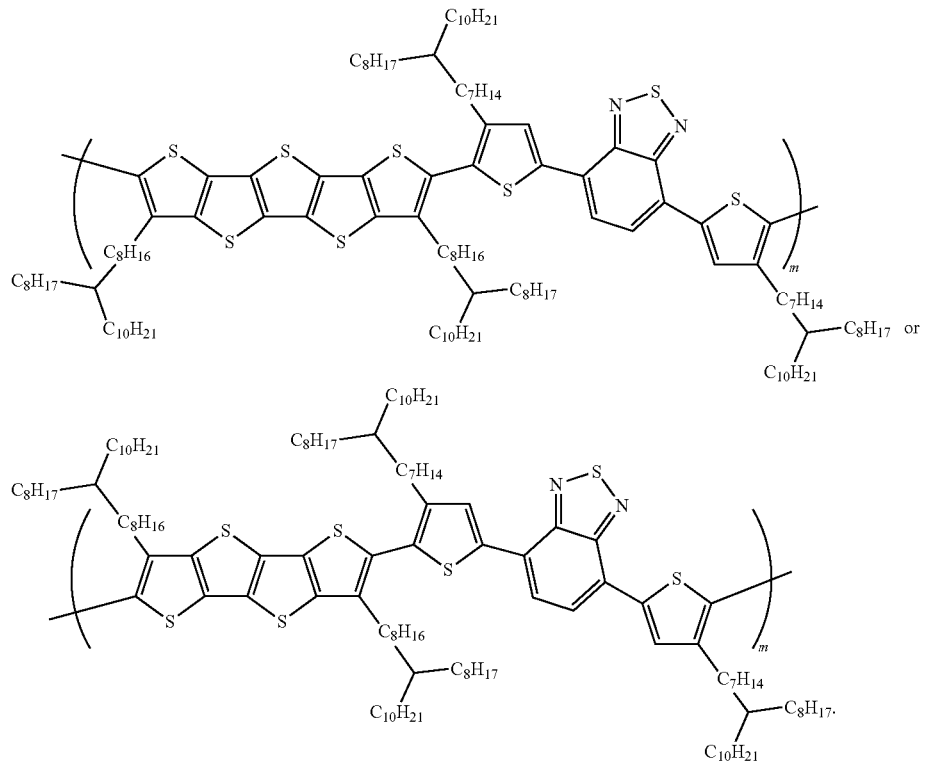
4. A method of making a compound of claim 1, comprising reacting a first compound of structure:
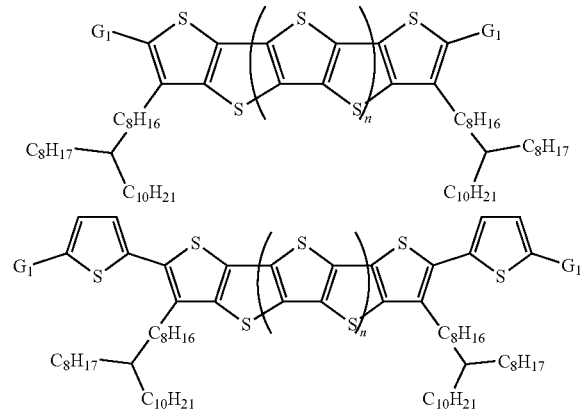
or
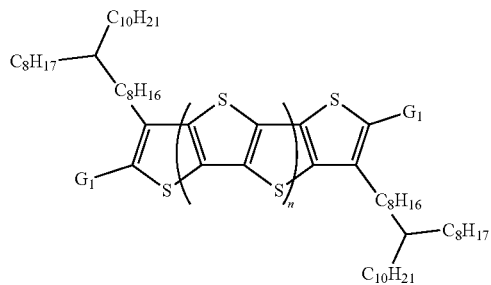
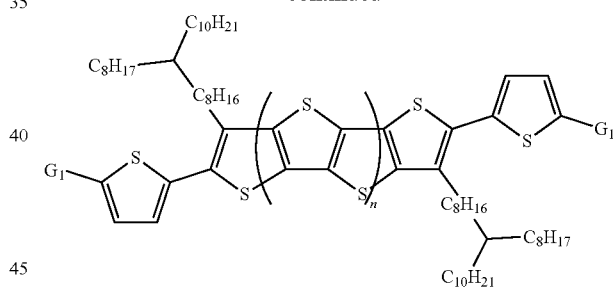
with a second compound of structure:
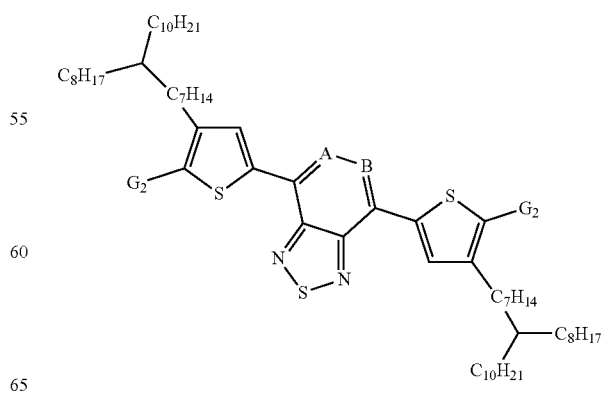

wherein:
    each of $G_1$ and $G_2$ is a halogen or $Sn(R_8)_3$, with the proviso that when $G_1$ is a halogen, $G_2$ is $Sn(R_8)_3$ and when $G_2$ is a halogen, $G_1$ is $Sn(R_8)_3$; and
    n is 1.

5. The method of claim 4, wherein the first compound is:

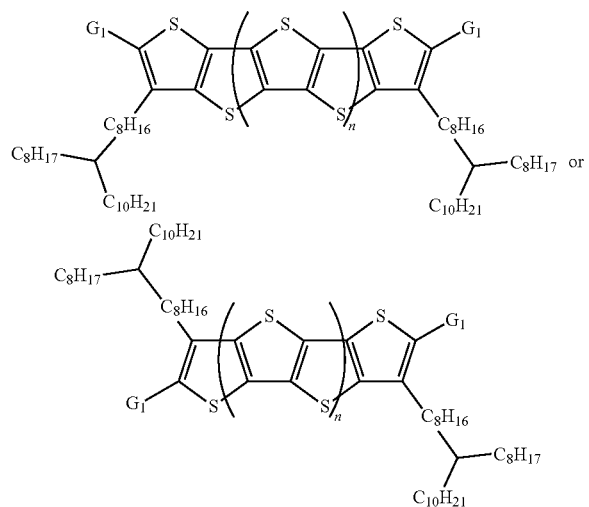

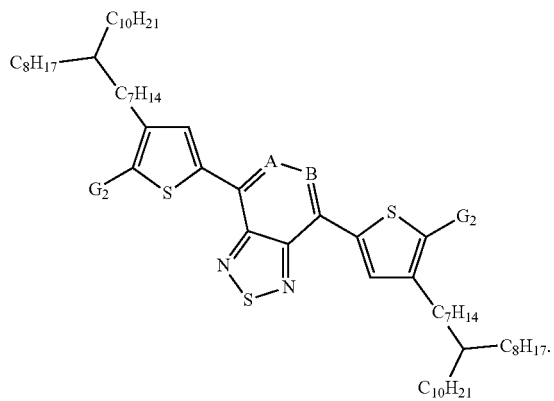

and the second compound is:

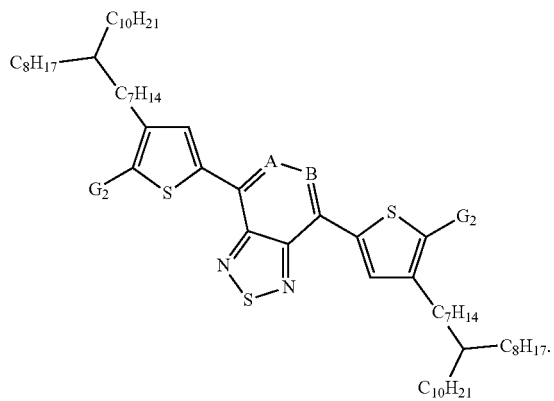

6. The method of claim 4, wherein the first compound is:

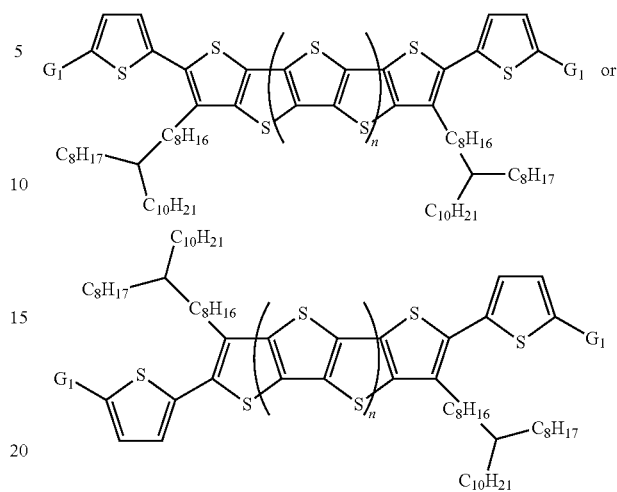

and the second compound is:

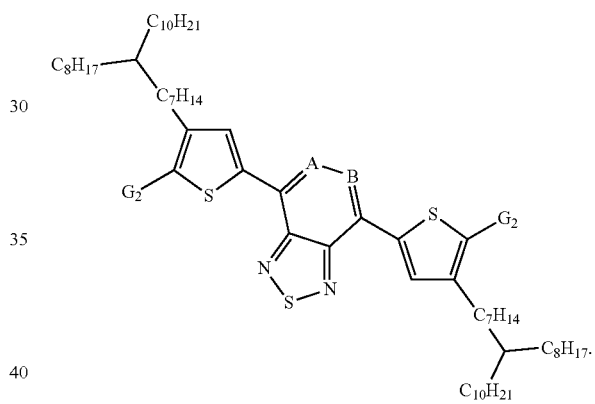

7. The method of claim 4, wherein the reaction occurs in the presence of a transition metal catalyst.

8. The method of claim 4, wherein the reaction occurs via a Stille-type reaction.

* * * * *

UNITED STATES PATENT AND TRADEMARK OFFICE
CERTIFICATE OF CORRECTION

PATENT NO. : 10,759,898 B2
APPLICATION NO. : 15/705722
DATED : September 1, 2020
INVENTOR(S) : Mingqian He et al.

Page 1 of 1

It is certified that error appears in the above-identified patent and that said Letters Patent is hereby corrected as shown below:

In the Claims

In Column 25, Lines 15-25, Claim 1, delete

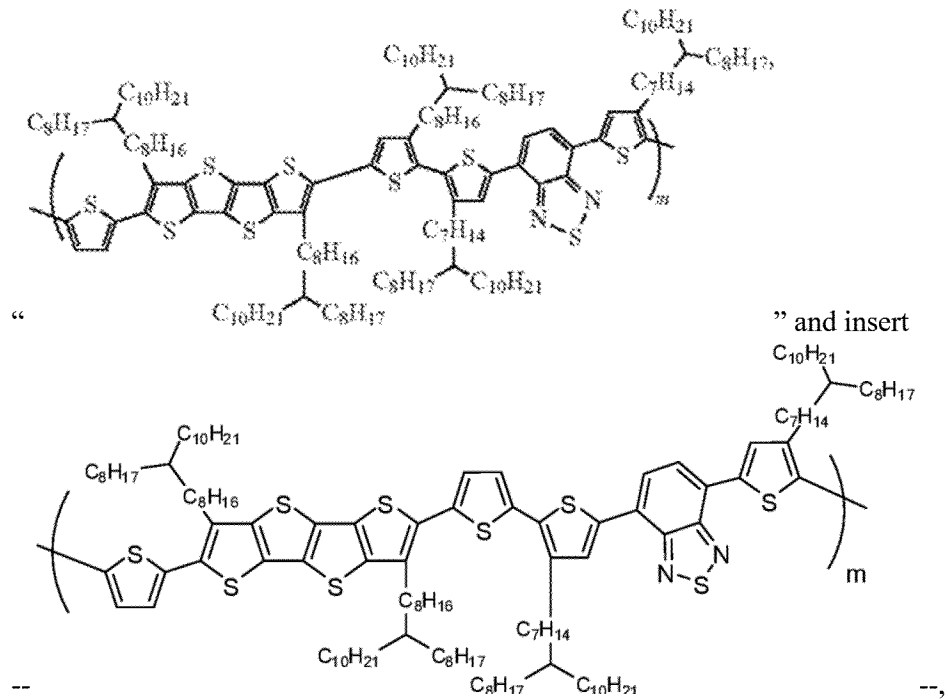

--, therefor.

Signed and Sealed this
First Day of November, 2022

Katherine Kelly Vidal
*Director of the United States Patent and Trademark Office*